US008604516B2

(12) United States Patent
 Wakita et al.

(10) Patent No.: US 8,604,516 B2
(45) Date of Patent: Dec. 10, 2013

(54) HETEROJUNCTION FIELD-EFFECT TRANSISTOR WITH FIELD PLATE CONNECTED TO GATE OR SOURCE ELECTRODE

(71) Applicant: Panasonic Corporation, Osaka (JP)

(72) Inventors: Naohide Wakita, Osaka (JP); Kenichiro Tanaka, Osaka (JP); Masahiro Ishida, Osaka (JP); Satoshi Tamura, Toyama (JP); Daisuke Shibata, Toyama (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/728,773

(22) Filed: Dec. 27, 2012

(65) Prior Publication Data

US 2013/0113018 A1    May 9, 2013

Related U.S. Application Data

(63) Continuation of application No. PCT/JP2011/002260, filed on Apr. 18, 2011.

(30) Foreign Application Priority Data

Jul. 30, 2010  (JP) .................................. 2010-171496

(51) Int. Cl.
 *H01L 29/205*  (2006.01)
(52) U.S. Cl.
 USPC .......................................................... 257/190
(58) Field of Classification Search
 CPC ..................................................... H01L 29/205
 USPC .......................................................... 257/190
 See application file for complete search history.

(56) References Cited

U.S. PATENT DOCUMENTS

2003/0006409 A1   1/2003   Ohba
2004/0155250 A1   8/2004   Ohba
(Continued)

FOREIGN PATENT DOCUMENTS

JP   2000-068498 A   3/2000
JP   2003-023220 A   1/2003
(Continued)

OTHER PUBLICATIONS

Kunihiro et al., "Experimental Evaluation of Impact Ionization Coefficients in GaN", IEEE Electron Device Letters, vol. 20, No. 12, pp. 608-610, Dec. 1999.

(Continued)

*Primary Examiner* — Walter H Swanson
(74) *Attorney, Agent, or Firm* — McDermott Will & Emery LLP

(57) ABSTRACT

A first group III nitride semiconductor layer has a low carbon concentration region having a carbon concentration of less than $1 \times 10^{17}$ cm$^{-3}$, and located in a region under an edge of a gate electrode closer to a drain electrode, a thickness d2 of the low carbon concentration region satisfies $V_m/(110 \cdot d1) \le d2 < V_m/(110 \cdot d1) + 0.5$ where d1 is a thickness of a nitride semiconductor layer including the first group III nitride semiconductor layer and the second group III nitride semiconductor layer, and $V_m$ is an operating breakdown voltage, and
a ratio of $R_{on}$ to $R_{on0}$, which is an index of a current collapse value, satisfies $R_{on}/R_{on0} \le 3$ where $R_{on0}$ is an on-state resistance in a relaxed state, and $R_{on}$ is an on-state resistance measured 100 μs after a transition from an off state to an on state under an operating voltage $V_m$.

10 Claims, 9 Drawing Sheets

(56) References Cited

U.S. PATENT DOCUMENTS

| | | |
|---|---|---|
| 2006/0102926 A1 | 5/2006 | Kikkawa et al. |
| 2006/0202272 A1* | 9/2006 | Wu et al. ............... 257/355 |
| 2009/0189190 A1 | 7/2009 | Hashimoto et al. |
| 2010/0230723 A1 | 9/2010 | Hashimoto et al. |
| 2011/0062556 A1 | 3/2011 | Komiyama et al. |
| 2011/0240962 A1 | 10/2011 | Ikuta et al. |

FOREIGN PATENT DOCUMENTS

| | | |
|---|---|---|
| JP | 2006-147663 A | 6/2006 |
| JP | 2006-332367 A | 12/2006 |
| JP | 2007-251144 A | 9/2007 |
| JP | 2010-245504 A | 10/2010 |
| JP | 2011-082494 A | 4/2011 |

OTHER PUBLICATIONS

International Search Report mailed Jul. 19, 2011 issued in corresponding International Application No. PCT/JP2011/002260.

* cited by examiner

HETEROJUNCTION FIELD-EFFECT TRANSISTOR WITH FIELD PLATE CONNECTED TO GATE OR SOURCE ELECTRODE

CROSS-REFERENCE TO RELATED APPLICATIONS

This is a continuation of International Application No. PCT/JP2011/002260 filed on Apr. 18, 2011, which claims priority to Japanese Patent Application No. 2010-171496 filed on Jul. 30, 2010. The entire disclosures of these applications are incorporated by reference herein.

BACKGROUND

The present disclosure relates to field effect transistors made of group III nitride semiconductors and applicable to power transistors for use in, for example, power supply circuits in consumer apparatuses etc.

Group III nitride semiconductors which are compound semiconductors represented by gallium nitride (GaN) have wider band gaps, high breakdown field strength and high saturated drift velocity of electrons, as compared to silicon (Si), gallium arsenide (GaAs), etc. In a heterostructure of aluminum gallium nitride (AlGaN)/gallium nitride (GaN) formed on a substrate whose main surface has a (0001) plane orientation (C plane), two-dimensional electron gas (2DEG) is generated at a heterointerface due to spontaneous polarization and piezo-polarization, and a sheet carrier concentration of $1\times10^{13}$ cm$^{-2}$ or more is obtained even when impurities are not doped. Particular attention has been recently drawn to field effect transistors (FETs) using such a high concentration 2DEG as a carrier, and various configurations have been proposed.

When GaN-based FETs are used, power transistors with lower power dissipation can be provided, but the element area is relatively large, and therefore, it has been desired to form GaN-based nitride semiconductors on an inexpensive conductive substrate, such as silicon (Si) or graphite (C), rather than an expensive sapphire substrate. However, if such GaN-based nitride semiconductors are formed on such a heterosubstrate, since the lattice constant and the coefficient of thermal expansion of the substrate are different from those of the nitride semiconductors, problems are likely to occur where a larger thickness of the nitride semiconductors allows a wafer to be bend, cracks to enter semiconductor films which have grown. Therefore, it is important to ensure the breakdown voltage and reliability of the semiconductors while reducing the thickness of the semiconductors as thin as possible.

FIG. 12 illustrates a schematic cross-sectional configuration of a conventional field effect transistor having an AlGaN/GaN heterostructure (for example, see Japanese Patent Publication No. 2007-251144).

As shown in FIG. 12, the conventional field effect transistor made of group III nitride semiconductors includes a low-temperature GaN buffer layer 12, a high resistance buffer layer made of GaN or AlGaN, an undoped GaN layer 14, and an undoped AlGaN layer 15 which are sequentially formed on a substrate 11. A source electrode 16 and a drain electrode 18 made of Ti and Al are formed on the undoped AlGaN layer 15. A gate electrode 17 made of Ni, Pt, and Au is formed in a region between the source electrode 16 and the drain electrode 18 on the undoped AlGaN layer 15.

The field effect transistor having such a configuration utilizes, as a carrier, two-dimensional electron gas formed on an interface between the undoped AlGaN layer 15 and the undoped GaN layer 14. When a voltage is applied between the source electrode 16 and the drain electrode 18, electrons in a channel drift from the source electrode 16 toward the drain electrode 18. At that time, a voltage applied to the gate electrode 17 is controlled to change the thickness of a depletion layer of the undoped AlGaN layer 15 located directly under the gate electrode 17, thereby making it possible to control the electrons drifting from the source electrode 16 to the drain electrode 18, thus, drain current.

In FETs made of GaN-based semiconductors, it has been known that a phenomenon called current collapse is observed, resulting in a problem when a device is operated. This is a phenomenon where, once a strong electric field is applied, for example, between a source and a drain, between the source and a gate, or between the drain and a substrate, then, channel current between the source and the drain decreases. In Japanese Patent Publication No. 2007-251144, a voltage between a drain and a source in the on state is swept in a range of 0 V-10V and 0 V-30 V, and a ratio of the obtained current value is defined as a current collapse value. Moreover, Japanese Patent Publication No. 2007-251144 discloses that, if the concentration of carbon added into a high resistance buffer layer 13 is $10^{17}$ cm$^{-3}$ or more and $10^{20}$ cm$^{-3}$ or less, or the thickness measured from the two-dimensional electron gas layer to the upper surface of the high resistance buffer layer 13 (hereinafter referred to as a channel layer) is 0.05 μm or more, current collapse is reduced enough not to cause practical problems. It also discloses that the carbon concentration of the high resistance buffer layer 13 of $10^{17}$ cm$^{-3}$ or more, and the thickness of the channel layer of 1 μm or less can ensure the breakdown voltage of 400 V or more, which is necessary for a commercial power supply.

SUMMARY

In the conventional example, current collapse is defined by the measurement of the voltage sweep in the on state to set the lower limit of the thickness of the channel layer etc.

However, in GaN-based FETs, in addition to current collapse depending on current in the on state, current collapse also occurs at high voltage switching, and current collapse increases with increasing the breakdown voltage at the time of switching. Power transistors are mostly utilized to repeatedly switch between the on state and the off state to control power like invertors. Therefore, if current collapse occurring at a time of switching from the off state to the on state is not sufficiently reduced within a range of the breakdown voltage which is used, problems, such as an increase in power loss at a high voltage, and deterioration of reproducibility of electrical characteristics, occur.

In view of the above problems, it is an object of the present disclosure to efficiently prevent or reduce current collapse at high voltage switching in a field effect transistor made of group III nitride semiconductors.

In order to attain the object, a field effect transistor according to the present disclosure a substrate, a first group III nitride semiconductor layer formed on the substrate, a second group III nitride semiconductor layer formed on the first group III nitride semiconductor layer, and having a band gap wider than that of the first group III nitride semiconductor layer, a source electrode and a drain electrode formed on the second group III nitride semiconductor layer, and a gate electrode formed between the source electrode and the drain electrode, and a field plate formed on the second group III nitride semiconductor layer to be connected to the gate electrode or the source electrode, and to cover an edge of the gate electrode closer to the drain electrode, wherein the first group III nitride semiconductor layer has a low carbon concentration region having a carbon concentration of less than $1\times10^{17}$ cm$^{-3}$, and located in at least a region under the edge of the gate electrode closer to the drain electrode, a thickness d2 (µm) of the low carbon concentration region satisfies $$V_m/(110\cdot d1) \leq d2 < V_m/(110\cdot d1)+0.5$$

where d1 (µm) is a thickness of a group III nitride semiconductor layer including the first group III nitride semiconductor layer and the second group III nitride semiconductor layer, and $V_m$(V) is an operating breakdown voltage, and a ratio of $R_{on}$ to $R_{on0}$, which is an index of a current collapse value, satisfies $$R_{on}/R_{on0} \leq 3$$

where $R_{on0}$ is an on-state resistance in a relaxed state, and $R_{on}$ is an on-state resistance measured 100 µs after a transition from an off state to an on state under an operating voltage $V_m$.

According to the field effect transistor of the present disclosure, in the field effect transistor in which the interface between the first group III nitride semiconductor layer and the second group III nitride semiconductor layer or the vicinity thereof serves as a channel, the thickness which is equal to or smaller than the critical thickness which can avoid the bending of the wafer or cracks can allow reduction of current collapse at a switching even if the operating voltage is high.

In the field effect transistor of the present disclosure, the thickness of the low carbon concentration region of the first group III nitride semiconductor layer is uneven, and a part of the low carbon concentration region located under an edge of the field plate closer to the drain electrode has a maximum thickness.

Such a feature can reduce leakage current while reducing the current collapse until the voltage reaches a high value.

In this case, a part of the low carbon concentration region located under a position closer to the source electrode has a minimum thickness.

Such a feature can further reduce the leakage current.

In the field effect transistor of the present disclosure, an increased-resistance region into which an impurity for improving insulation properties of the first group III nitride semiconductor layer is added is formed in a region of the low carbon concentration region located under a region extending from a middle portion of the gate electrode to a portion of the gate electrode closer to the source electrode along a gate length direction.

With such a configuration, the increased-resistance region can reduce the current leakage.

In this case, the impurity may be at least one of iron, boron, magnesium, zinc, or rubidium.

The field effect transistor of the present disclosure may further include one or more buffer layers formed between the substrate and the first group III nitride semiconductor layer.

Such a configuration can sufficiently control crystallinity in the first group III nitride semiconductor layer.

In this case, the one or more buffer layers are sequentially formed on the substrate, and include a first buffer layer, a second buffer layer, and a third buffer layer each made of a group III nitride semiconductor.

In this case, $E_{g1}$, $E_{g2}$, and $E_{g3}$ satisfy $$E_{g1} > E_{g2} > E_{g3}$$

where $E_{g1}$ is a band gap of the first buffer layer, $E_{g2}$ is a band gap of the second buffer layer, and $E_{g3}$ is a band gap of the third buffer layer.

In this case, a carbon concentration of each of the one or more buffer layers may be $10^{18}$ cm$^{-3}$ or more.

In this case, a carbon concentration of each of the one or more buffer layers is $10^{19}$ cm$^{-3}$ or more and $10^{21}$ cm$^{-3}$ or less.

Such a feature can ensure the breakdown voltage of the field effect transistor.

The present disclosure can achieve a field effect transistor having a high breakdown voltage which can reduce current collapse at high voltage switching.

BRIEF DESCRIPTION OF THE DRAWINGS

FIG. 4A is a distribution diagram when a drive voltage is 160 V, and FIG. 4B is a distribution diagram when a drive voltage is 400 V.

DETAILED DESCRIPTION

Embodiment

A field effect transistor according to an embodiment of the present disclosure will be described with reference to FIGS. 1-7.

Figure 1:
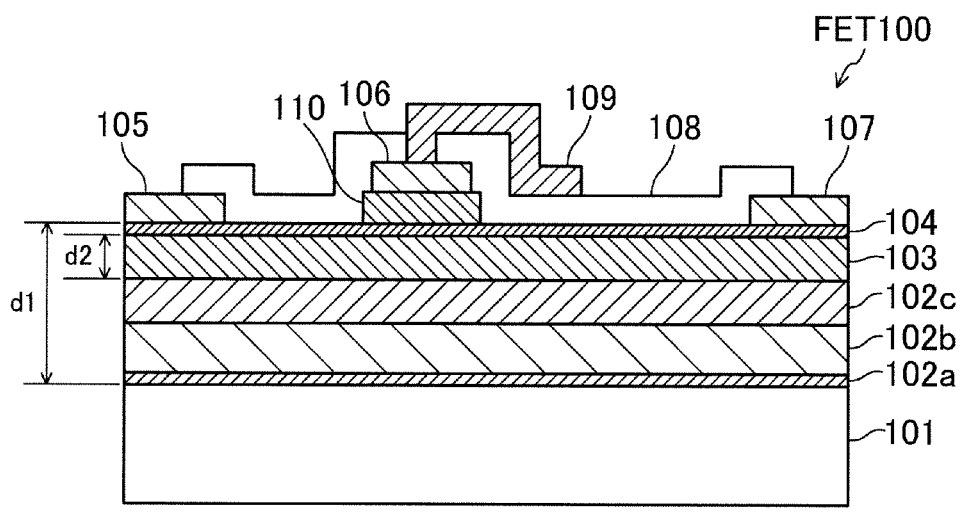
FIG. 1 is a schematic cross-sectional view showing a field effect transistor made of a group III nitride semiconductor according to an embodiment of the present disclosure.

As shown in FIG. 1, a field effect transistor FET 100 according to the embodiment includes, through a first semi-insulating buffer layer 102a, a second semi-insulating buffer layer 102b, and a third semi-insulating buffer layer 102c sequentially formed on the main surface of a substrate 101, a first semiconductor layer 103 made of a first group III nitride semiconductor, and a second semiconductor layer 104 made of a second group III nitride semiconductor having a band gap wider than that of the first group III nitride semiconductor.

A source electrode 105 and a drain electrode 107 are formed to be spaced apart electrode 105 and the drain electrode 107 on the second semiconductor layer 104, the gate electrode 106 is formed. A p-type GaN layer 110 is provided between the second semiconductor layer 104 and the gate electrode 106. The p-type GaN layer 110 is provided between the second semiconductor layer 104 and the gate electrode 106, whereby a threshold voltage increases within a positive value, and the FET 100 becomes a normally-off type transistor.

The total thickness of a semiconductor layer including the buffer layers 102a-102c, the first semiconductor layer 103, the second semiconductor layer 104 is referred to as d1 (μm), and the thickness of the first semiconductor layer 103 which is a layer having a low carbon concentration is referred to as d2 (μm).

It is preferable that a substrate which is made of silicon and whose main surface has a (111) plane orientation be used as the substrate 101 in view of fabrication costs. Silicon carbide (SiC) or graphite (C) can be used as the substrate 101.

Each of the semi-insulating buffer layers 102a, 102b, and 102c is provided to alleviate a stress due to a difference between the lattice constant of the substrate 101 and the lattice constant of the first semiconductor layer 103, and to control crystallinity of the first semiconductor layer 103. For example, it is preferable to use aluminum nitride (AlN) as the first buffer layer 102a, and AlGaN having a superlattice structure obtained by stacking pairs of $Al_xGa_{1-x}N/Al_yGa_{1-y}N$ or multiple layers of AlGaN as the second buffer layer 102b. It is preferable to use, for example, GaN or AlGaN including a small amount of Al as the third buffer layer 102c. As materials of the buffer layers 102a, 102b, and 102c, $Al_xGa_{1-x}N$ ($0 \leq x \leq 1$) of group III nitrides is suitable, and other materials, such as boron nitride (BN) etc., can be used as long as they are suitable to control crystallinity. Since the buffer layers 102a, 102b, and 102c must have semi-insulating properties, it is necessary to increase, when using $Al_xGa_{1-x}N$, the resistance of $Al_xGa_{1-x}N$ to be high by impurities such as carbon (C) etc. Therefore, when carbon is added, each of the carbon concentration in each of the buffer layers 102a, 102b, and 102c is preferably $10^{18}$ cm$^{-3}$ or more, and more preferably $10^{19}$ cm$^{-3}$ or more and $10^{21}$ cm$^{-3}$ or less to ensure the breakdown voltage. When the band gap of the first buffer layer 102a is referred to as $E_{g1}$, the band gap of the second buffer layer 102b is referred to as $E_{g2}$, and the band gap of the third buffer layer is referred to as $E_{g3}$, it is preferable to satisfy a relationship expressed by the following expression 1:

$$E_{g1} > E_{g2} > E_{g3} \quad \text{(Expression 1)}$$

The first semiconductor layer 103 formed on the third buffer layer 102c is made of a group III nitride semiconductor including GaN as a main component, and therefore, the material is not limited to GaN, and InAlGaN including a small amount of In or Al may be used. The material may have a structure formed by stacking GaN on AlGaN having a lower Al composition ratio, or a structure formed by stacking InGaN on GaN. The first semiconductor layer 103 is a layer having a low carbon concentration of $8 \times 10^{16}$ cm$^{-3}$ or less to reduce current collapse. In a condition for forming a layer having a low carbon concentration, the growth rate is mostly extremely slow, and therefore, the first semiconductor layer 103 is formed to have a thickness as thin as possible enough to reduce current collapse, and such condition of formation improves productivity.

The second semiconductor layer 104 is made of AlGaN or AlInGaN whose band gap is wider than that of the first semiconductor layer 103, and have a thickness of 25 nm-60 nm.

An insulating film 108 made of, for example, silicon nitride (SiN), silicon dioxide ($SiO_2$), or hafnium oxide ($HfO_2$), formed by a chemical vapor deposition (CVD) method etc. is provided on the second semiconductor layer 104. The gate electrode 106 is formed by stacking, for example, platinum (Pt) or palladium (Pd) and gold (Au), and, a film formed by stacking, for example, titanium (Ti) and aluminum (Al) can be used as the source electrode 105 and the drain electrode 107 which are in ohmic contact with each other.

An opening is provided in a portion of the insulating film 108 located on the gate electrode 106. Moreover, a field plate 109 is formed on the insulating film 108, the field plate 109 having one edge filling the opening and the other edge extending toward a side closer to the drain electrode 107. The field plate 109 prevents an application of a high electric field to the edge of the gate electrode 106 to reduce current collapse. In the embodiment, the field plate 109 is a conductive film made of a metal or a semiconductor and covering a region which extends from the edge of the gate electrode 106 closer to the drain electrode 107 to the middle portion between the gate electrode 106 and the drain electrode 107, and in which electric field intensity is likely to be the highest. The field plate 109 may be conducted to the gate electrode 106 as shown in FIG. 1, and may be conducted to the source electrode 105.

One example of a method of fabricating the field effect transistor FET 100 having such a configuration will be described hereinafter.

As shown in FIG. 1, the layers from the first buffer layer 102a to the second semiconductor layer 104 are sequentially formed on the main surface of the substrate 101 made of a p-type silicon whose main surface has a (111) plane orientation, by epitaxial growth by, e.g., a metal organic chemical vapor deposition (MOCVD) method.

Trimethylgallium (TMG), triethylgallium (TEG), and trimethylaluminum (TMA) are used as a material of a group III element. Ammonia ($NH_3$) is used as a material of a group V element (nitrogen material), and hydrogen ($H_2$) or nitrogen ($N_2$) is used as carrier gas.

As the first buffer layer 102a, AlN having a thickness of approximately 200 nm is used, and the second buffer layer 102b having a superlattice structure of stacked 50 pairs of $Al_{0.2}Ga_{0.8}N$ having a thickness of 5 nm and GaN having a thickness of 20 nm is used, and its total thickness is 1.25 μm. As the third buffer layer 102c, GaN having a thickness of approximately 1 μm is used. The buffer layers 102a-102c are formed at a temperature of 1100° C. According to an elementary analysis by secondary ion mass spectroscopy (SIMS), each of the buffer layers 102a-102c has a carbon concentration of $1 \times 10^{18}$ cm$^{-3}$-$5 \times 10^{19}$ cm$^{-3}$.

Next, the first semiconductor layer 103 made of GaN is formed on the third buffer layer 102c, and subsequently, the second semiconductor layer 104 made of $Al_{0.2}Ga_{0.8}N$ and having a thickness of approximately 50 nm is formed on the first semiconductor layer 103. The carbon concentration in each of the semiconductor layers 103 and 104 can be lowered if the formation temperature, the ratio value between a group V element and a group III element in the material, and the voltage are set to be high.

Next, the p-type GaN layer 110 in which magnesium (Mg) is doped is formed on the second semiconductor layer 104. Thereafter, the p-type GaN layer 110 is subjected to a predetermined patterning treatment by a lithography method and an etching method.

Next, the source electrode 105 and the drain electrode 107 which are made of a film formed by stacking Ti/Al are formed at both sides of the p-type GaN layer 110 on the second semiconductor layer 104 by an electron-beam (EB) evaporation method and a well-known fine processing technique. Then, by the EB evaporation method and the well-known fine processing technique, the gate electrode 106 made of Pd/Au is formed on the p-type GaN layer 110. In this step, the source electrode 105, the drain electrode 107, and the gate electrode 106 may be formed in any sequence.

Next, the insulating film 108 made of silicon nitride and having a thickness of 100 nm is formed on the second semiconductor layer 104 including the source electrode 105, the drain electrode 107, and the gate electrode 106 by a heat CVD method. Then, the openings for forming a contact is formed in a portion of the insulating film 108 which has been formed on the source electrode 105, the drain electrode 107, and the gate electrode 106 by a lithography method and an etching method. Subsequently, the field plate 109 made of Ti/Au and extending from the opening of the insulating film 108 on the gate electrode 106 toward a side closer to the drain electrode 107 is formed by a vacuum evaporation method etc.

Regarding the field effect transistor FET 100 according to the embodiment fabricated as described above, the present inventors evaluated current collapse at a switching operation by changing the applied voltage and the temperature to consider a configuration which can improve the current collapse at the switching operation.

Current collapse occurs when electrons trapped by a charge trap including crystal defects or impurities inhibits formation of two-dimensional electron gas (2DEG). While carbon (C) of gallium nitride (GaN) forms a trap whose energy level is deep, and can trap electrons of GaN, it can be a cause of current collapse. Therefore, the present inventors have found that a layer having a low carbon concentration (the first semiconductor layer 103) is effective to reduce current collapse, whereas, due to the off voltage (the drain-source voltage), it cannot reduce current collapse unless the thickness of the layer is made to have an appropriate size.

Figure 2:
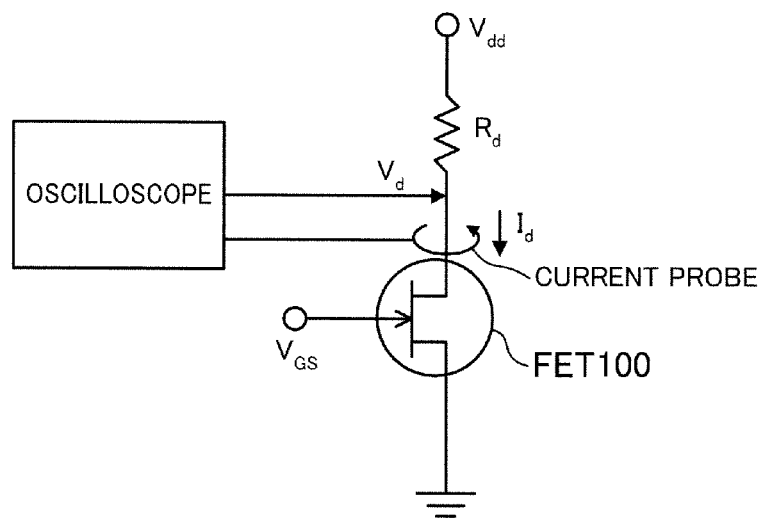
FIG. 2 is a configuration showing an evaluation system (measurement circuit) evaluating current collapse at a switching in the field effect transistor according to the embodiment of the present disclosure.

FIG. 2 shows an evaluation system (measurement circuit) used for the evaluation. As shown in FIG. 2, a load resistance $R_d$ is connected to a drain terminal of the FET 100 in series, a drive voltage $V_{dd}$ is applied in the entire measurement circuit. The measurement circuit corresponds to an electric circuit used when, for example, an illumination apparatus is connected to the FET 100 in series, and the duty ratio of the FET 100 is controlled to control the intensity of the illumination apparatus.

In other words, a gate-source voltage $V_{GS}$ of the FET 100 is controlled to switch the FET 100 between the on state and the off state to measure a voltage $V_d$ and a current value $I_d$ of the drain terminal by a current probe. This measurement can determine an on-state resistance $R_{on}$ in the FET 100 since the on-state resistance $R_{on}$ satisfies a relationship: $R_{on}=V_d/I_d$. After the FET 100 is in the off state for a predetermined period of time, e.g., 150 seconds, the FET 100 is switched to be in the on state, and the on-state resistance is measured for 100 µs immediately after the switching. The on-state resistance is repeatedly measured while the drive voltage $V_{dd}$ is gradually increased from a low voltage of approximately 5 V. When the drive voltage $V_{dd}$ is extremely low, current collapse hardly occurs, and therefore, the value of the on-state resistance when the drive voltage $V_{dd}$ is 5 V is referred to as an on-state resistance $R_{on0}$ in a relaxed state, and a ratio $R_{on}/R_{on0}$ obtained by dividing the value of the on-state resistance $R_{on}$ when the drive voltage $V_{dd}$ is relatively high by the on-state resistance $R_{on0}$ is referred to as an $R_{on}$ ratio which is an index of the value of current collapse. Therefore, the closer the value of the $R_{on}$ ratio becomes to 1, the smaller the current collapse becomes, while the larger the value of the $R_{on}$ ratio becomes than 1, the larger the current collapse becomes.

Figure 3:
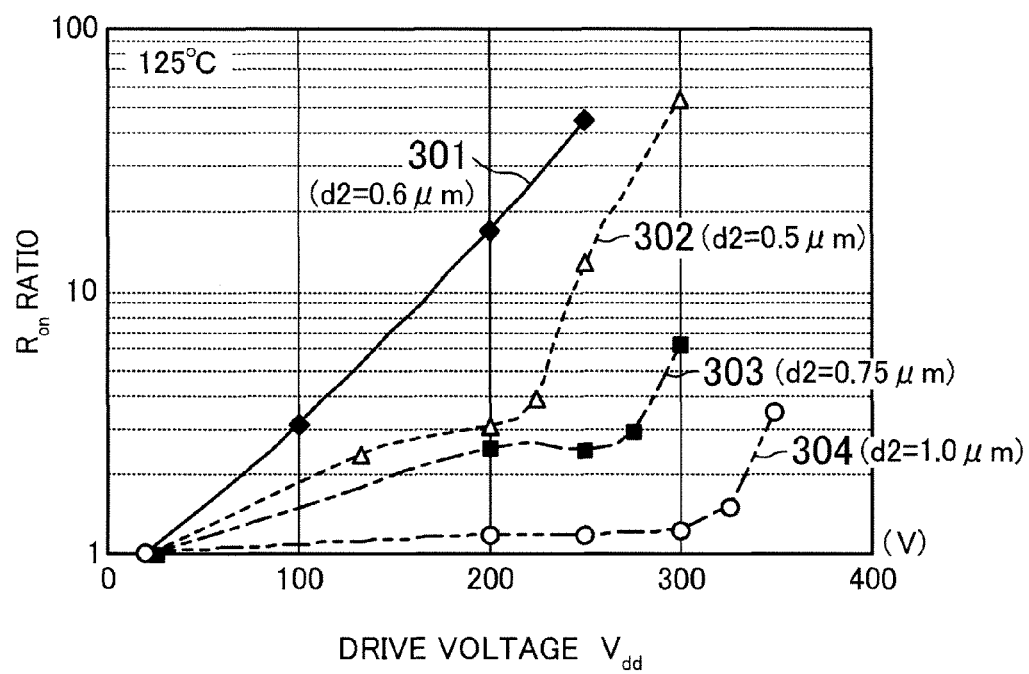
FIG. 3 is a diagram showing characteristics indicating a relationship between a drive voltage and current collapse according to the embodiment of the present disclosure.

FIG. 3 a diagram showing characteristics of a plurality of FETs having the configuration of the FET 100 shown in FIG. 1 and fabricated so that each of the FETs includes one of four types of the thickness d2 of the first semiconductor layer 103 which is a layer having a low carbon concentration, where the horizontal axis represents the drive voltage $V_{dd}$, and the vertical axis represents the logarithmic value of the $R_{on}$ ratio under a temperature of 125° C.

In FIG. 3, a curve denoted by a reference character 301 shows a case where the thickness d2 of the first semiconductor layer 103 is 0.6 µm, and the carbon concentration of the first semiconductor layer 103 is $2 \times 10^{17}$ cm$^{-3}$ which is relatively large. The $R_{on}$ ratio in this case increases linearly from a low voltage. In contrast, when the carbon concentration is less than $1 \times 10^{17}$ cm$^{-3}$, e.g., on the order of $10^{16}$ cm$^{-3}$, in a curve denoted by a reference character 302 with the thickness d2 of 0.5 µm, a curve denoted by a reference character 303 with the thickness d2 of 0.75 µm, and a curve denoted by a reference character 304 with the thickness d2 of 1.0 µm, the current collapse is extremely small if each drive voltage $V_{dd}$ is a threshold voltage $V_{th}$ or less, whereas the current collapse rapidly increases if each drive voltage $V_{dd}$ is a threshold voltage $V_{th}$ or more. The threshold voltage $V_{th}$ increases with increasing the thickness d2 of the first semiconductor layer 103. The values of the threshold voltage $V_{th}$ are 225 V, 280 V, and 330 V when the values of the thickness d2 are 0.5 µm, 0.75 µm, and 1.0 µm, respectively. The carbon concentration is measured by secondary ion mass spectroscopy (SIMS) and the measurement limit of SIMS is $5 \times 10^{16}$ cm$^{-3}$. Therefore, when a layer having a low carbon concentration of less than $1 \times 10^{17}$ cm$^{-3}$ which is close to the measurement limit is provided in region below the interface between the first semiconductor layer 103 and the second semiconductor layer 104, the current collapse is low until the voltage reaches a high value, and threshold voltage dependence is shown, as shown in the curves 302-304.

Figure 4A:
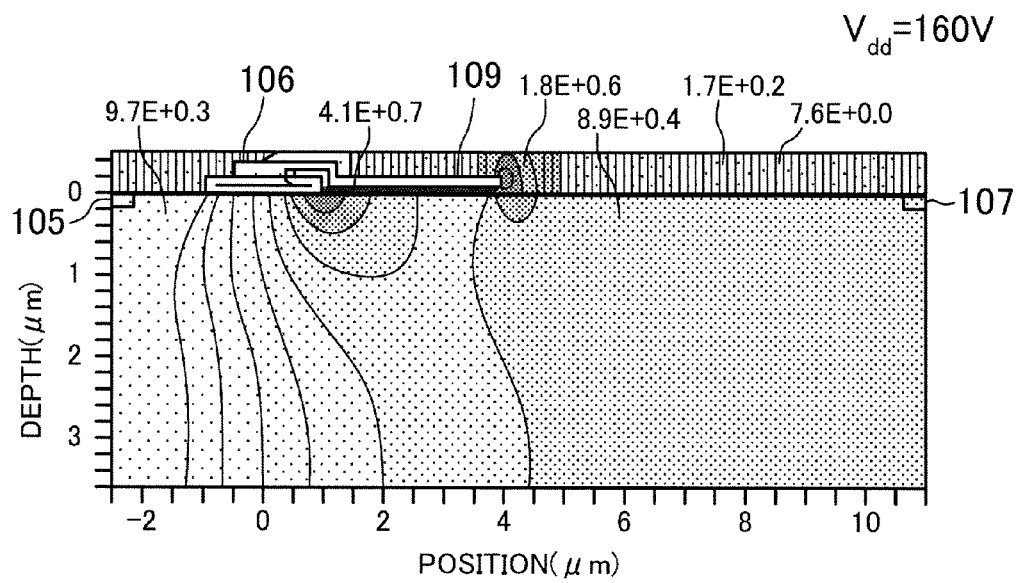
FIGS. 4A and 4B are distribution diagrams analyzing an electric field intensity distribution in the field effect transistor according to the embodiment of the present disclosure.
Figure 4B:
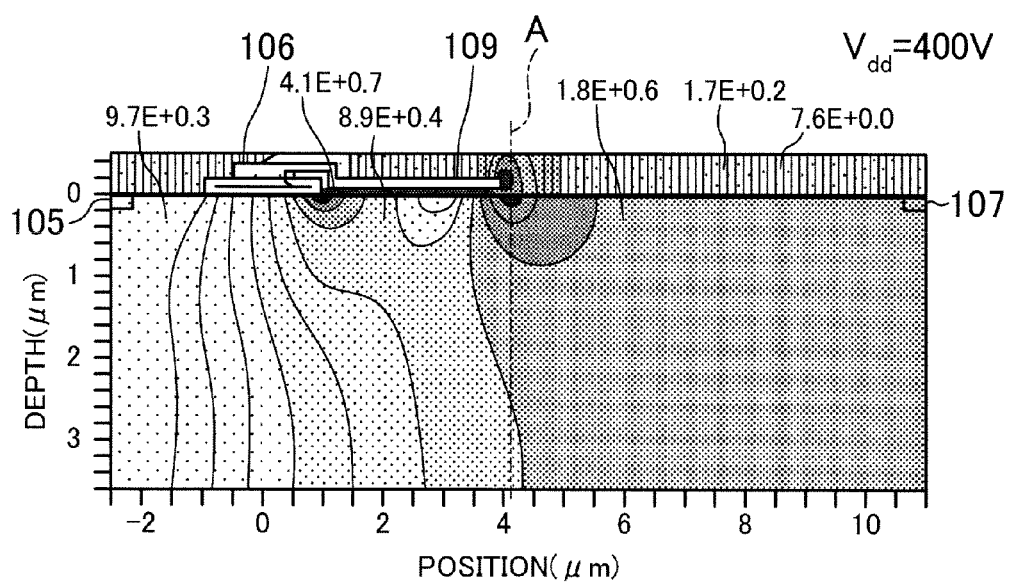

The present inventors observed the cause of the above phenomenon by calculating an electric field intensity distribution in the inside of a FET element. The results will be shown in FIGS. 4A and 4B. As examples, FIG. 4A shows the electric field intensity distribution in the FET element when the drive voltage $V_{dd}$ is 160 V, and FIG. 4B shows the electric field intensity distribution in the FET element when the drive voltage $V_{dd}$ is 400 V. Values of electric field intensity (unit: V/m) are attached to FIGS. 4A and 4B as references. When FIGS. 4A and 4B are compared to each other, contour lines showing electric field intensity vary together, and electric field intensity considerably varies in a region near the right side of the field plate 109 (closer to the drain electrode 107).

Figure 5:
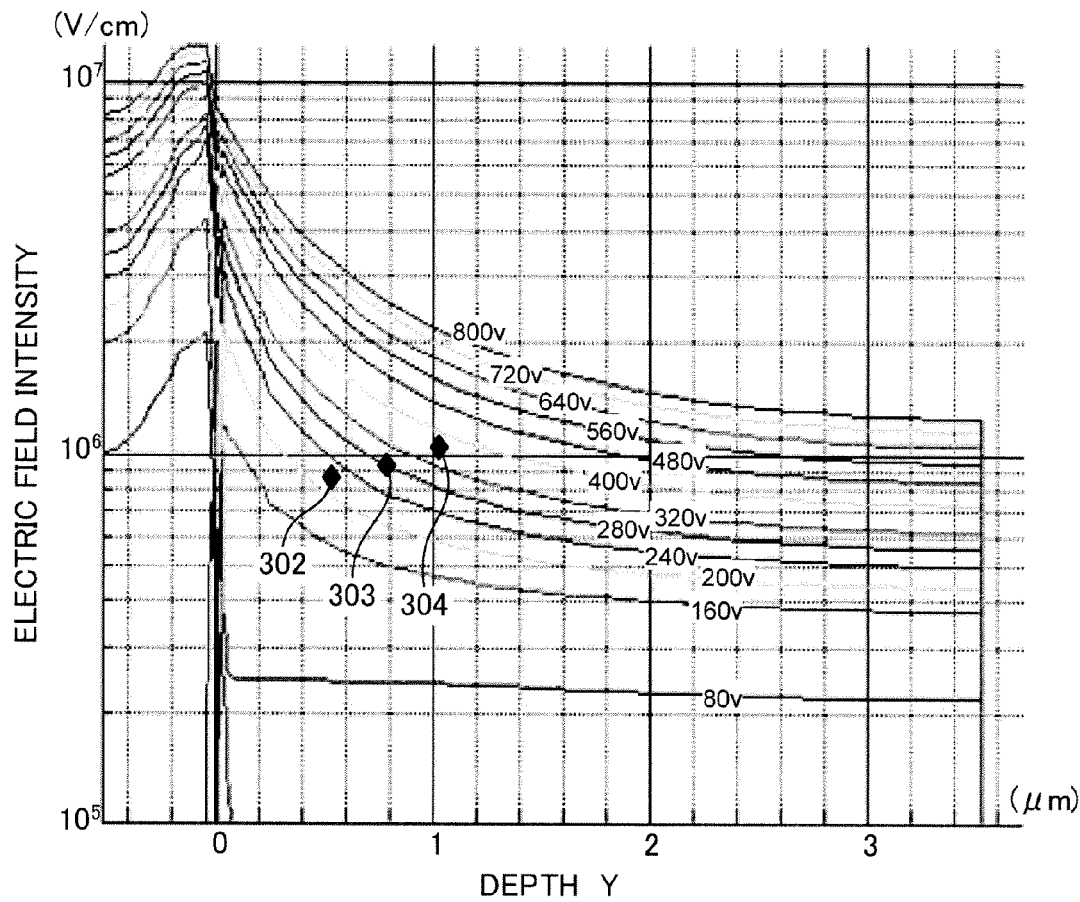
FIG. 5 is a distribution diagram showing a relationship between a depth of an edge of a field plate and electric field intensity in the field effect transistor according to the embodiment of the present disclosure.

FIG. 5 is a diagram of electric field intensity in the cross-section of a portion (alternate long and short dash line A) spaced apart from the right edge of the field plate 109 shown in FIG. 4B by 0.2 µm, the diagram obtained by changing the drive voltage $V_{dd}$. In FIG. 5, the horizontal axis represents a depth Y (µm) by assuming the surface of the second semiconductor layer 104 to be 0 µm, the vertical axis represents the logarithmic description of electric field intensity (V/cm), and the values of the drive voltage $V_{dd}$ are shown in each curve. As shown in FIG. 5, the electric field intensity is less changed in a deeper region of the second semiconductor layer 104, whereas in a region of the second semiconductor layer 104 closer to the surface of the second semiconductor layer 104, the electric field intensity rapidly increases as the position becomes closer to the surface thereof.

In the diagram of FIG. 5, points located in the curves each corresponding to the drive voltage $V_{dd}$ (=threshold voltage $V_{th}$) at which the current collapse rapidly increases and each matching the thickness d2 of the first semiconductor layer 103 in the horizontal axis of FIG. 5 are plotted as diamond shaped points 302, 303, and 304. In other words, each of the diamond shaped points 302, 303, and 304 shows electric field intensity at the interface between the first semiconductor layer 103 and the third buffer layer 102c when the drive voltage $V_{dd}$ at which the current collapse rapidly increases is applied Therefore, based on FIG. 5, when the electric field intensity at the interface between the first semiconductor layer 103 and the third buffer layer 102c exceeds a range of $0.8 \times 10^{16}$ V/cm-$1 \times 10^{16}$ V/cm, the current collapse rapidly increases. The value of the electric field intensity is equal to that of electric field intensity in which an impact ionization coefficient of GaN (coefficient showing how many electron hole pairs are generated by an electron traveling a unit distance) increases, and leakage current begins to occur due to avalanche breakdown (for example, see Kazuaki Kunihiro, Kensuke Kasahara, Yuji Takahashi, and Yasuo Ohno, "Experimental Evaluation of Impact Ionization Coefficients in GaN", IEEE ELECTRON DEVICE LETTERS, VOL. 20, NO. 12, p. 609, 1999).

Therefore, the cause why the current collapse rapidly increases with increasing the off voltage may be that, while a strong electric field extends into a deeper layer along with the increase of the off, and a charge is generated due to impact ionization, current collapse is hardly deteriorated (exacerbated) in the first semiconductor layer 103 which is a layer having a low carbon concentration of $5 \times 10^{16}$ cm$^{-3}$ or less, and when the strong electric field reaches the third buffer layer 102c having a higher carbon concentration, the current collapse rapidly increases. To put it the other way, in order to reduce the current collapse enough not to cause practical problems, electric field intensity applied to a buffer layer having a high carbon concentration, thus, a region of the third buffer layer 102c, in particular, a region under the edge of the gate electrode 106 closer to the drain electrode 107 or the edge of the field plate 109 closer to the drain electrode 107 in this case may be reduced to be $5 \times 10^5$ V/cm or less.

In order to reduce the electric field intensity applied to the third buffer layer 102c, the thickness d2 of the first semiconductor layer 103 may be made thicker to allow the third buffer layer 102c to be further from the interface between the first semiconductor layer 103 and the second semiconductor layer 104. Or the total thickness d1 of the semiconductor layer including the buffer layers 102a-102c, the first semiconductor layer 103, and the second semiconductor layer 104 may be made thicker.

Figure 6:
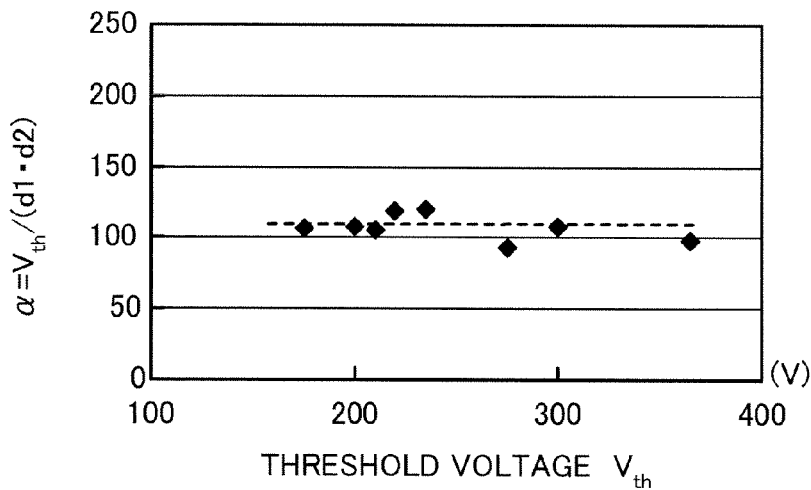
FIG. 6 shows a scatter diagram indicating a relationship between a thickness and a threshold voltage under which current collapse at the switching is deteriorated in the field effect transistor according to the embodiment of the present disclosure.

FIG. 6 shows a scatter diagram where, in a plurality of FET elements having threshold voltages $V_{th}$ different from each other, the horizontal axis represents the threshold voltage $V_{th}$ at which current collapse rapidly increases by heating the FET elements at a temperature of 125° C., and the vertical axis represents an equation $\alpha = V_{th}/(d1 \cdot d2)$ obtained by dividing the threshold voltage $V_{th}$ by the product of d1 and d2. Specifically, in the multiple samples fabricated in the same step, the thickness d2 of a layer having a low carbon concentration of less than $1 \times 10^{17}$ cm$^{-3}$, and the total thickness d1 of the semiconductor layer are measured through secondary ion mass spectroscopy (SIMS) by a scanning electron microscope (SEM). Moreover, by using the evaluation system shown in FIG. 2, the temperature of each of the samples is set to be 125° C. and current collapse in each of the samples is measured, and voltages at which current collapse rapidly increases are plotted as the threshold voltage $V_{th}$.

As shown in FIG. 6, a is generally constant with having an average value of 110 and some variations regardless of the threshold voltage $V_{th}$. In other words, the threshold voltage $V_{th}$ is proportional to the product of d1·d2. Since current collapse is small when the voltage is in the range of the threshold voltage $V_{th}$ or less, if the thicknesses d1 and d2 are set so as to be in a range of $V_m < V_{th} \leq \alpha \times (d1 \cdot d2)$ where $V_m$ represents an operating breakdown voltage, it is possible to reduce the current collapse enough not to cause practical problems. In FIG. 6, the working temperature of 125° C. is assumed, and if the working temperature varies, the threshold voltage $V_{th}$ at which current collapse rapidly increases varies, too. For example, when the temperature is 25° C., the value of the threshold voltage $V_{th}$ is 1.45 times that of the threshold voltage $V_{th}$ when the temperature is 125° C., and when the temperature is 50° C., the value of the threshold voltage $V_{th}$ is 1.25 times that of the threshold voltage $V_{th}$ when the temperature is 125° C. Therefore, as a conditional expression of the FET capable of stably operating even at a high temperature of 125° C., the following expression 2 may be satisfied:

$$V_m \leq 110 \times (d1 \cdot d2) \tag{Expression 2}$$

Figure 7:
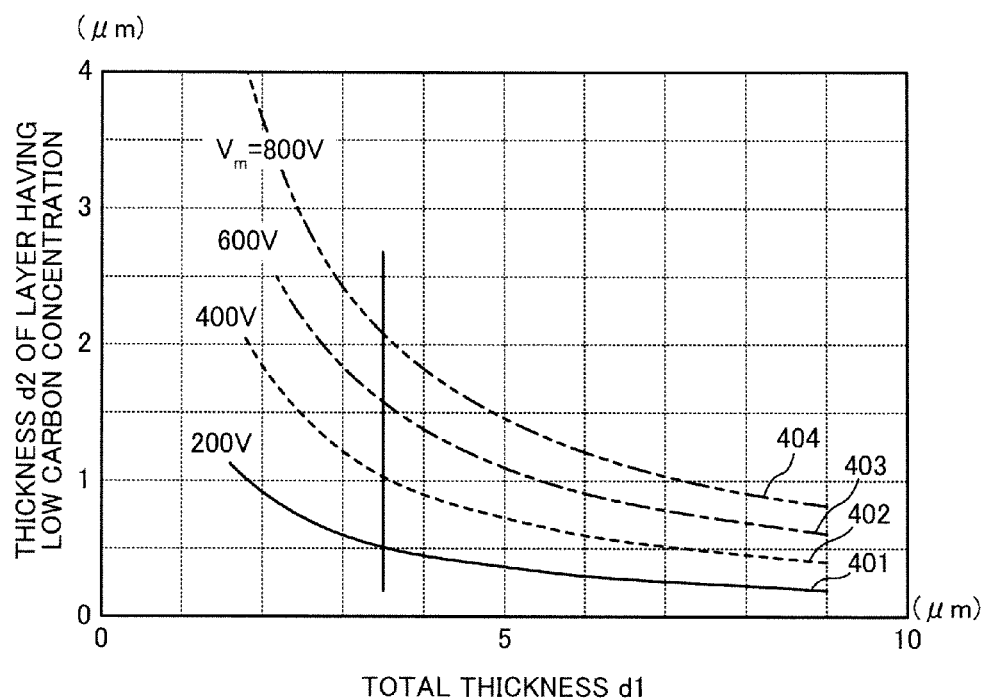
FIG. 7 is a diagram showing characteristics indicating the range of the thickness of a semiconductor layer which can reduce current collapse at the switching in the field effect transistor according to the embodiment of the present disclosure.

FIG. 7 is a correlation diagram showing Expression 2 with respect to the different operating breakdown voltages $V_m$, where the horizontal axis represents the total thickness d1 of the semiconductor layer, and the vertical axis represents the thickness d2 of the first semiconductor layer 103 which is the layer having a low concentration. In FIG. 7, boundaries when the values of the operating breakdown voltage $V_m$ are 200 V, 400 V, 600 V, and 800 V are expressed as hyperbolas 401-404. When the total thickness d1 and the thickness d2 are thicker, current collapse is reduced, and the total thickness d1 is limited under a critical thickness under which bending and cracks occur depending on, for example, the substrate 101 or the layer configuration of the semiconductor, and the thickness which is slightly smaller than the critical thickness and which achieves a stable formation of the layers is the upper limit of the total thickness d1. For example, in FIG. 7, when the total thickness d1 is 3.5 μm, and the operating breakdown voltage $V_m$ is 400 V, the lower limit of the thickness d2 of the layer having a low carbon concentration enough to be able to reduce current collapse is approximately 1.04 μm. Even when the operating breakdown voltage $V_m$ is 200 V, the thickness d2 of the layer having a low carbon concentration has to be 0.5 μm or more. The digit number of this value is different from that of the value of the thickness d2 shown in the conventional example in which, if the thickness d2 of the layer having a low carbon concentration is 0.05 μm or more, current collapse occurring when a voltage in the on state is swept is reduced enough not to cause problems. That is because, in the conventional example, 2DEG exists in the entire region between the source and the drain in the on state, and a strong electric field does not extend into a deeper layer. The mechanism of occurrence of current collapse in the conventional example is different from that of current collapse, occurring at a switching, which is the problem to be solved in the present disclosure, and is a different problem from the present disclosure.

As described above, a rate for forming the layer having a low carbon concentration is slow, and leakage current is more likely to increase when the thickness of the semiconductor layer is thicker, and therefore, it is preferable to make the thickness d2 of the layer having a low carbon concentration as thin as possible. Therefore, the thickness d2 of the layer having a low carbon concentration within the range of the operating breakdown voltage $V_m$ may be in a range expressed by the following Expression 3 with the upper limit obtained by adding a margin of 0.5 μm to the lower limit of Expression 2:

$$V_m/(110\sqrt{d1}) \leq d2 < V_m/(110 \cdot d1)+0.5 \quad \text{(Expression 3)}$$

While, when the operating breakdown voltage $V_m$ rapidly increases, the thickness d2 of the layer having a low carbon concentration becomes larger based on Expression 3, a leakage current increases when the thickness d2 of the first semiconductor layer 103 which is a layer having a low carbon concentration is even like the configuration of FIG. 1. As is seen from the electric field intensity distribution shown in FIG. 4, a strong electric field occurs at each of the edge of the gate electrode 106 and the edge of the field plate 109 which are closer to the drain electrode 107, and electric field intensity in other regions is weak. When the field plate 109 is provided, the electric field intensity at the gate edge is saturated at a predetermined value, and the electric field intensity is $0.5 \times 10^6$ V/cm or more when the depth of the semiconductor layer measured from the surface thereof is in a range up to approximately 0.5 μm. In contrast, in the region near the edge of the field plate 109 closer to the drain electrode 107, the electric field intensity extends into a deeper layer with increasing the drive voltage $V_{dd}$. Therefore, current collapse can be reduced if the region near the edge of the field plate 109 closer to the drain electrode 107 and the edge of the gate electrode 106 closer to the drain electrode 107 in the first semiconductor layer 103 which is a layer having a low carbon concentration are made thicker. Moreover, a leakage current can be reduced if the thickness d2 of other regions, in which electric field intensity is weak, of the first semiconductor layer 103 is made thinner.

A first variation in which the thickness of the first semiconductor layer 103 which is a layer having a low carbon concentration is not even, and in particular, the thickness of a portion of the first semiconductor layer 103 located under the edge of the field plate 109 closer to the drain electrode 107 increases, and a second variation in which an increased-resistance region is formed in a portion of the first semiconductor layer 103 located under the edge of the gate electrode 106 closer to the drain electrode 107 will be described hereinafter.

First Variation of Embodiment

The first variation of the embodiment in the present disclosure will be described hereinafter with reference to FIGS. 8 and 9. The same reference characters as those shown in the above embodiment are used to represent equivalent elements.

Figure 8:
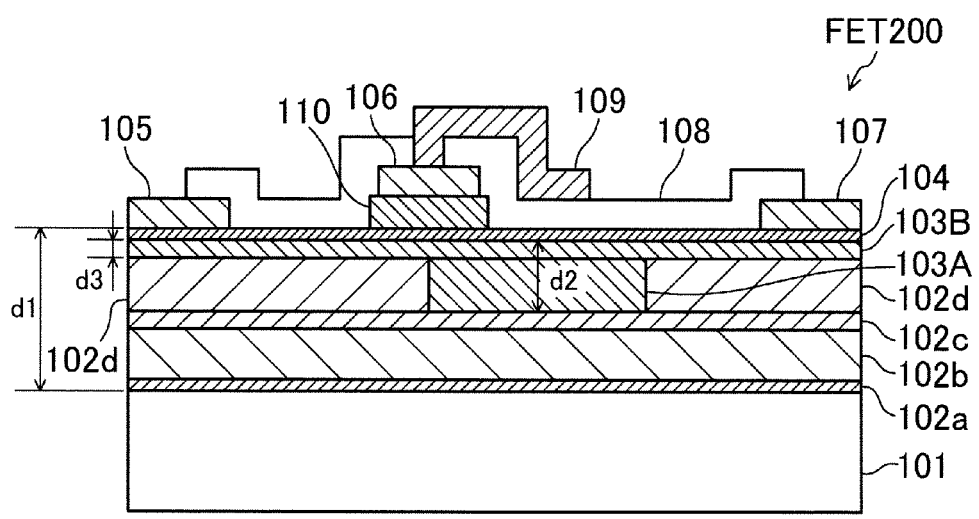
FIG. 8 is a schematic cross-sectional view showing a field effect transistor according to a first variation of the embodiment of the present disclosure.

As shown in FIG. 8, in a FET 200 according to the first variation, a first semiconductor layer 103 which is a layer having a low carbon concentration is formed so as to have a thickness d2 satisfying Expression 3 in a region under a region which extends from a position near the edge of a gate electrode 106 closer to a drain electrode 107 to a position near the edge of a field plate 109 closer to the drain electrode 107, and have a thickness d3 made thinner than the thickness d2 in other regions.

Specifically, the region of first semiconductor layer 103 under the region which extends from the position near the edge of the gate electrode 106 closer to the drain electrode 107 to the position near the edge of the field plate 109 closer to the drain electrode 107 is composed of a first lower semiconductor layer 103A and a first upper semiconductor layer 103B, and regions at both ends of the first semiconductor layer 103 are composed of a fourth buffer layer 102d made of GaN, having substantially the same thickness as that of the first lower semiconductor layer 103A, and having a carbon concentration of $1 \times 10^{19}$ cm$^{-3}$. Therefore, the thickness of the first upper semiconductor layer 103B is d3.

If the operating breakdown voltage $V_m$ is 400 V, and the total thickness d1 of a semiconductor layer including buffer layers 102a-102c, the first semiconductor layer 103, and a second semiconductor layer 104 is 3.5 μm, the thickness d2 of the first lower semiconductor layer 103A and the first upper semiconductor layer 103B is approximately 1.2 μm. Moreover, the thickness d3 of the first upper semiconductor layer 103B is in a range of 0.5 μm-0.1 μm, thereby making it possible to reduce a leakage current. If the thickness of the first upper semiconductor layer 103B is thinner than that of a layer in which 2DEG is distributed, the on-state resistance increases, and therefore, it is preferable that the thickness d3 of the first upper semiconductor layer 103B be 0.1 μm or more.

A method of fabricating the FET 200 having such a configuration will be described with reference to FIGS. 9A-9C.

First, as well as the method of fabricating the FET 100, the layers from the first buffer layer 102a to the second semiconductor layer 104 are formed by epitaxial growth by a MOCVD method etc.

Figure 9A:
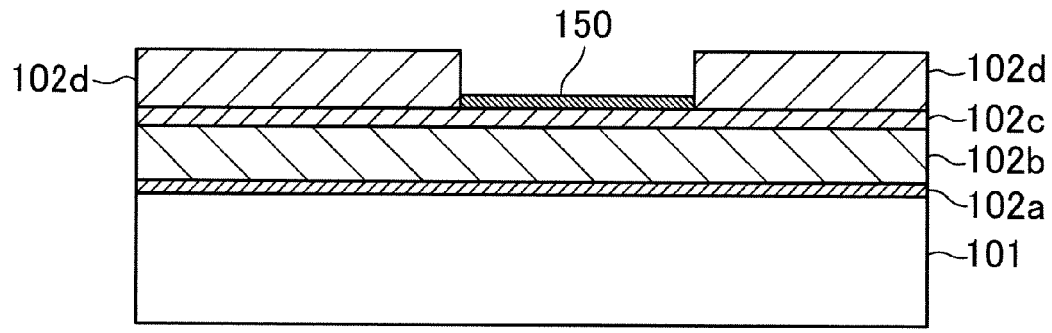
FIGS. 9A-9C are cross-sectional views of main steps showing a method of fabricating the field effect transistor according to the first variation.

Next, as shown in FIG. 9A, a mask film 150 made of, e.g., silicon oxide (SiO$_2$) is selectively formed on the third buffer layer 102c in a region which extends from the edge of the gate electrode 106 to which a strong electric field is applied and which is closer to the drain electrode 107 to the edge of the field plate 109 which is closer to the drain electrode. Subsequently, by a MOCVD method etc., the fourth buffer layer 102d made of GaN, having a thickness of 1 μm, and having a carbon concentration of $1 \times 10^{19}$ cm$^{-3}$ is grown on the third buffer layer 102c on which the mask film 150 is formed. With this growth, the fourth buffer layer 102d is formed in a self-aligned manner on the third buffer layer 102c except a region where the mask film 150 is formed.

Figure 9B:
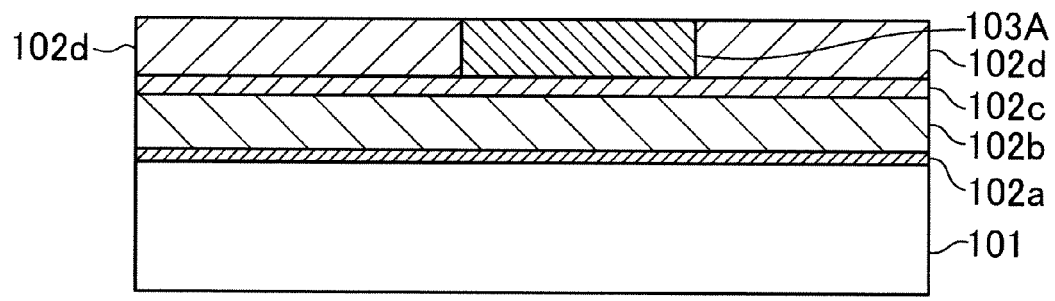

Next, as shown in FIG. 9B, the mask film 150 is removed by a solution of, e.g., hydrogen fluoride (HF) etc. Then, the first lower semiconductor layer 103A is formed under a condition that it grows in the horizontal direction (a direction parallel to the main surface of the substrate 101), for example, the use of dimethylhydrazine as a group V material. At this time, the first lower semiconductor layer 103A grows in the horizontal direction on the C plane, not in the C axis direction (a direction perpendicular to the main surface). With this growth, the recessed portion of the fourth buffer layer 102d can be filled with the first lower semiconductor layer 103A which is a layer having a low carbon concentration.

Figure 9C:
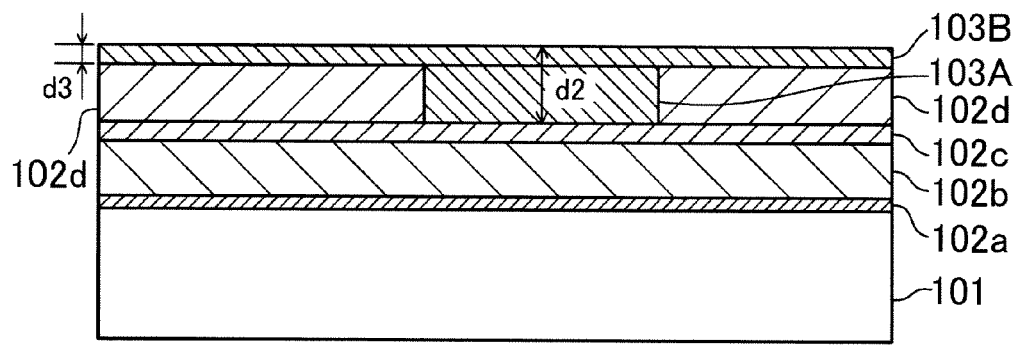

Next, as shown in FIG. 9C, by using ammonia generally used as the group V material, the first upper semiconductor layer 103B which is a layer having a low carbon concentration and having a thickness of 0.3 μm is formed on the fourth buffer layer 102d and the first lower semiconductor layer 103A. The total thickness d2 of the first lower semiconductor layer 103A and the first upper semiconductor layer 103B formed in the region in which the field plate is to be formed in the subsequent step is 1.3 μm, and the thickness of a region of the layer having a low carbon concentration except a region of the layer on which the field plate is to be formed is 0.3 μm which is the thickness of the first upper semiconductor layer 103B.

Then, the FET 200 shown in FIG. 8 is fabricated by steps similar to those in the embodiment.

In the FET 200 according to the first variation, the total thickness d1 is approximately 3.8 μm, and the total thickness d2 of the first lower semiconductor layer 103A and the first upper semiconductor layer 103B is 1.3 μm. In the FET 200 having such a configuration, current collapse have a small value of 3 or less even if the drive voltage exceeds 500 V. The leakage current can be reduced to be one fifth or less of that in the layer having a low carbon concentration and having an even thickness of 1.3 μm.

Second Variation of Embodiment

The second variation of the embodiment in the present disclosure will be described hereinafter with reference to FIGS. 10 and 11.

Figure 10:
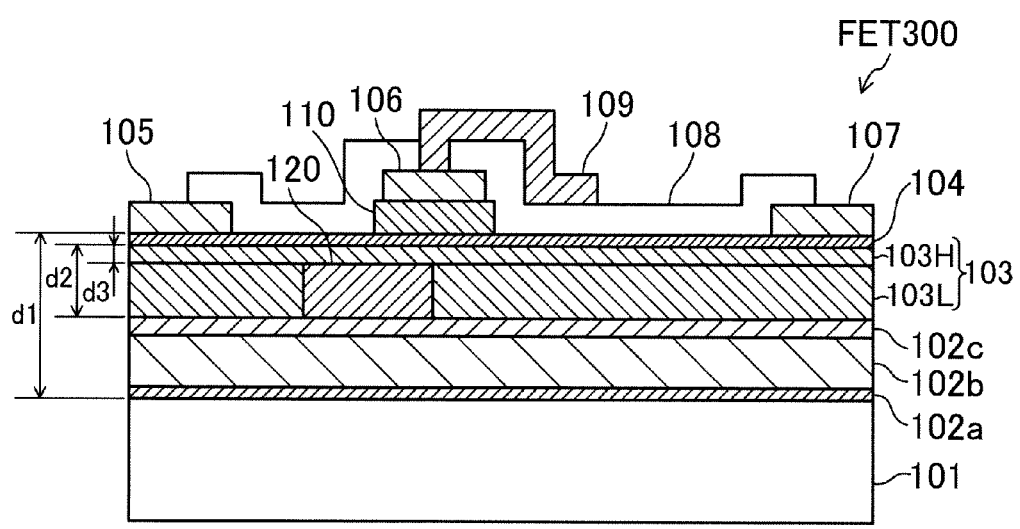
FIG. 10 is a schematic cross-sectional view showing a field effect transistor according to a second variation of the embodiment of the present disclosure.

As shown in FIG. 10, in a FET 300 according to the second variation, a first semiconductor layer 103 which is a layer having a low carbon concentration and which has a thickness d2 is composed of a first lower semiconductor layer 103L and a first upper semiconductor layer 103H formed on the first lower semiconductor layer 103L and having a thickness d3. Moreover, an increased-resistance region 120 in which impurities, such as iron (Fe), boron (B), magnesium (Mg), zinc (Zn), or rubidium (Rb), for increasing the resistance of gallium nitride (GaN) are doped is provided in the first lower semiconductor layer 103L under part of a region which extends from the edge of a gate electrode 106 closer to a source electrode 105 to a position closer to the source electrode 105.

If a layer having a low carbon concentration is thick, a deep region located further from the gate electrode 106 becomes a leakage path. However, the increased-resistance region 120 provided in the first lower semiconductor layer 103L which is a layer having a low carbon concentration includes many impurities functioning as electron traps, and therefore, leakage current can be reduced. In a region of the first lower semiconductor layer 103L under a region of the gate electrode 106 closer to the edge of the drain electrode 107, a strong electric field is applied, and therefore, the increased-resistance region 120 may be provided in a region which is located in a deeper portion under a portion of the gate electrode 106 closer to the source electrode 105 than the middle portion of the gate electrode 106 whose electric field is weak is, and under the first upper semiconductor layer 103H having the thickness d3 thinner than the thickness d2 in Expression 3 as well as the first variation of FIG. 8.

A method of fabricating the FET 300 having such a configuration will be described with reference to FIGS. 11A-11C.

First, as well as the method of fabricating the FET 100, the layers from the first buffer layer 102a to the third buffer layer 102c are formed by epitaxial growth by a MOCVD method etc.

Figure 11A:
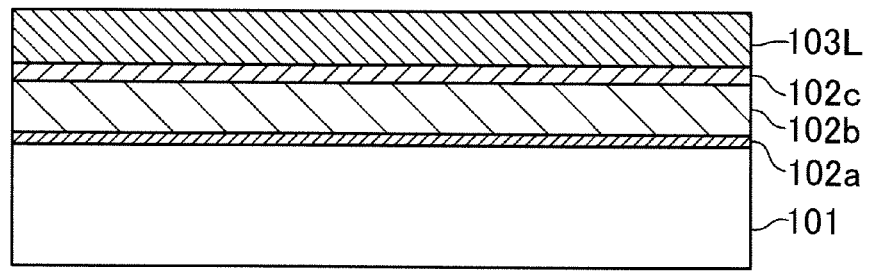
FIGS. 11A-11C are cross-sectional views of main steps showing a method of fabricating the field effect transistor according to the second variation.

Next, as shown in FIG. 11A, the first lower semiconductor layer 103L having a thickness of 1 μm, and having a low carbon concentration of approximately $5 \times 10^{16}$ cm$^{-3}$ is grown on the third buffer layer 102c.

Figure 11B:
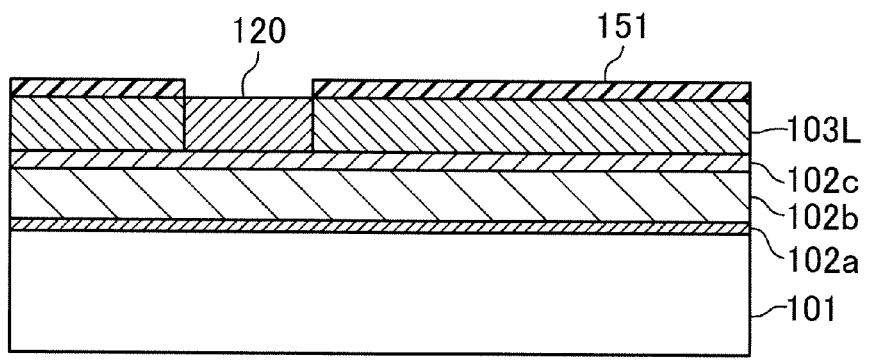

Next, as shown in FIG. 11B, a resist film 151 having an opening pattern in a region for forming the increased-resistance region is formed on the first lower semiconductor layer 103 L by a lithography method. Subsequently, for example, boron is ion implanted into the first lower semiconductor layer 103L through the resist film 15, thereby selectively forming the increased-resistance region 120 in a predetermined region of the first lower semiconductor layer 103L.

Figure 11C:
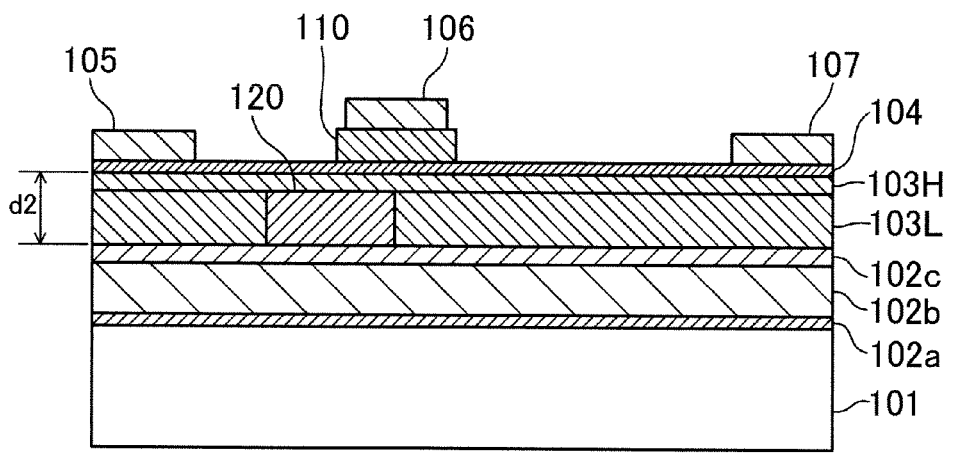
Figure 12:
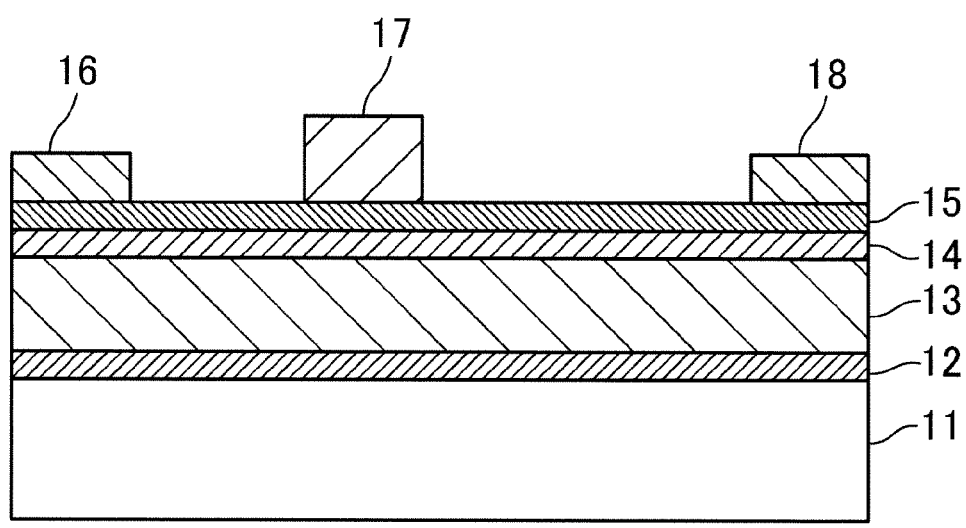
FIG. 12 is a schematic cross-sectional view of a conventional field effect transistor made of a group III nitride semiconductor.

Next, as shown in FIG. 11C, after the resist film 151 is removed, the first upper semiconductor layer 103H having the thickness of 0.3 μm and a low carbon concentration is grown on the first lower semiconductor layer 103L including the increased-resistance region 120. Then, the second semiconductor layer 104 is formed on the first upper semiconductor layer 103H, and moreover, a p-type GaN layer 110 is selectively formed on the second semiconductor layer 104. Then, the source electrode 105 and the drain electrode 107 are formed on the second semiconductor layer 104, and moreover, the gate electrode 106 is formed on the p-type GaN layer 110.

Thereafter, the FET 300 shown in FIG. 10 will be fabricated by steps similar to those in the embodiment.

In the FET 300 according to the second variation, the edge of the increased-resistance region 120, provided in the first lower semiconductor layer 103L, closer to the gate electrode 106 is located 0.5 μm further from a position under the edge of the gate electrode 106 closer to the source electrode 105, and overlaps the gate electrode 106. The edge of the increased-resistance region 120 closer to the source electrode 105 extends toward the middle portion between the source electrode 105 and the gate electrode 106. The implanted boron reaches the third buffer layer 102c.

In this way, in the FET 300 according to the second variation, the total thickness d1 of the semiconductor layer is approximately 3.8 μm, and the total thickness d2 of the first lower semiconductor layer 103L which is a layer having a low carbon concentration and the first upper semiconductor layer 103H is 1.3 μm. In the FET 300 having such a configuration, current collapse can have a small value of 3 or less even if the drive voltage exceeds 500 V. The leakage current reduced to be one fifth or less of that in the layer having a low carbon concentration and having an even thickness of 1.3 μm.

While the field effect transistor according to the embodiment and the variations of the present disclosure has been described as described above, the present disclosure is not limited to the embodiment and the variations. Variations, not departing from the scope of the present disclosure, anticipated by those skilled in the art are included within the scope of the present disclosure.

For example, while GaN has been used as the first semiconductor layer 103 in the above embodiment, but the material of the first semiconductor layer 103 is not limited to GaN, and $Al_{1-x-y}Ga_xIn_yN$ (0≤x≤1, 0≤y≤1) based semiconductor materials including small amounts of, e.g., Al and In, may be used, and materials having a stacked structure of, e.g., $Al_{1-x-y}Ga_xIn_yN$ (0≤x≤1, 0≤y≤1) and GaN, may be used.

The field effect transistor according to the present disclosure can reduce current collapse at high voltage switching, and the present disclosure is useful for field effect transistors etc. made of group III nitride semiconductors, and applicable to power transistors for use in, for example, power supply circuits in consumer apparatuses etc.

What is claimed is:
1. A field effect transistor, comprising:
a substrate;
a first group III nitride semiconductor layer formed on the substrate;
a second group III nitride semiconductor layer formed on the first group III nitride semiconductor layer, and having a band gap wider than that of the first group III nitride semiconductor layer;
a source electrode and a drain electrode formed on the second group III nitride semiconductor layer, and a gate electrode formed between the source electrode and the drain electrode; and
a field plate formed on the second group III nitride semiconductor layer to be connected to the gate electrode or the source electrode, and to cover an edge of the gate electrode closer to the drain electrode, wherein the first group III nitride semiconductor layer has a low carbon concentration region having a carbon concentration of less than $1\times10^{17}$ cm$^{-3}$, and located in at least a region under the edge of the gate electrode closer to the drain electrode, a thickness d2 (μm) of the low carbon concentration region satisfies $$V_m/(110 \cdot d1) \leq d2 < V_m/(110 \cdot d1) + 0.5$$

where d1 (μm) is a thickness of a group III nitride semiconductor layer including the first group III nitride semiconductor layer and the second group III nitride semiconductor layer, and $V_m$(V) is an operating breakdown voltage, and a ratio of $R_{on}$ to $R_{on0}$, which is an index of a current collapse value, satisfies $$R_{on}/R_{on0} \leq 3$$

where $R_{on0}$ is an on-state resistance in a relaxed state, and $R_{on}$ is an on-state resistance measured 100 μs after a transition from an off state to an on state under an operating voltage $V_m$.

2. The field effect transistor of claim 1, wherein
the thickness of the low carbon concentration region of the first group III nitride semiconductor layer is uneven, and a part of the low carbon concentration region located under an edge of the field plate closer to the drain electrode has a maximum thickness.

3. The field effect transistor of claim 2, wherein
a part of the low carbon concentration region located under a position closer to the source electrode has a minimum thickness.

4. The field effect transistor of claim 1, wherein
an increased-resistance region into which an impurity for improving insulation properties of the first group III nitride semiconductor layer is added is formed in a region of the low carbon concentration region located under a region extending from a middle portion of the gate electrode to a portion of the gate electrode closer to the source electrode along a gate length direction.

5. The field effect transistor of claim 4, wherein
the impurity is at least one of iron, boron, magnesium, zinc, or rubidium.

6. The field effect transistor of claim 1, further comprising
one or more buffer layers formed between the substrate and the first group III nitride semiconductor layer.

7. The field effect transistor of claim 6, wherein
the one or more buffer layers are sequentially formed on the substrate, and include a first buffer layer, a second buffer layer, and a third buffer layer each made of a group III nitride semiconductor.

8. The field effect transistor of claim 7, wherein
$E_{g1}$, $E_{g2}$, and $E_{g3}$ satisfy $$E_{g1} > E_{g2} > E_{g3}$$

where $E_{g1}$ is a band gap of the first buffer layer, $E_{g2}$ is a band gap of the second buffer layer, and $E_{g3}$ is a band gap of the third buffer layer.

9. The field effect transistor of claim 6, wherein
a carbon concentration of each of the one or more buffer layers is $10^{18}$ cm$^{-3}$ or more.

10. The field effect transistor of claim 6, wherein
a carbon concentration of each of the one or more buffer layers is $10^{19}$ cm$^{-3}$ or more and $10^{21}$ cm$^{-3}$ or less.

\* \* \* \* \*